US012620452B2

(12) United States Patent
Schaefer et al.

(10) Patent No.: US 12,620,452 B2
(45) Date of Patent: May 5, 2026

(54) DIFFERENTIAL STROBE FAULT IDENTIFICATION

(71) Applicant: Micron Technology, Inc., Boise, ID (US)

(72) Inventors: Scott E. Schaefer, Boise, ID (US); Paul A. Laberge, Shoreview, MN (US)

(73) Assignee: Micron Technology, Inc., Boise, ID (US)

(*) Notice: Subject to any disclaimer, the term of this patent is extended or adjusted under 35 U.S.C. 154(b) by 112 days.

(21) Appl. No.: 18/443,948

(22) Filed: Feb. 16, 2024

(65) Prior Publication Data

US 2024/0282400 A1        Aug. 22, 2024

Related U.S. Application Data

(60) Provisional application No. 63/447,262, filed on Feb. 21, 2023.

(51) Int. Cl.
| | |
|---|---|
| *G11C 29/52* | (2006.01) |
| *G11C 29/02* | (2006.01) |
| *G11C 29/50* | (2006.01) |
| *G11C 7/22* | (2006.01) |

(52) U.S. Cl.
CPC ............ *G11C 29/52* (2013.01); *G11C 29/023* (2013.01); *G11C 7/222* (2013.01); *G11C 29/50012* (2013.01)

(58) Field of Classification Search
CPC . G11C 29/52; G11C 29/023; G11C 29/50012; G11C 7/22; G11C 7/222
See application file for complete search history.

(56) References Cited

U.S. PATENT DOCUMENTS

| | | | |
|---|---|---|---|
| 2021/0090641 A1* | 3/2021 | Strand | G11C 11/5628 |
| 2021/0090680 A1* | 3/2021 | Bangalore Lakshman | |
| | | | G11C 29/52 |
| 2021/0090681 A1* | 3/2021 | Harms | G11C 29/021 |
| 2021/0304805 A1* | 9/2021 | Visconti | G11C 29/4401 |
| 2023/0395182 A1* | 12/2023 | Schaefer | G11C 29/023 |

* cited by examiner

*Primary Examiner* — Ly D Pham
(74) *Attorney, Agent, or Firm* — Holland & Hart LLP

(57) ABSTRACT

Methods, systems, and devices for differential strobe fault indication are described. A memory device may be configured to indicate a fault using a read strobe signal. The read strobe signal may be a read data strobe (RDQS) signal, such as a true RDQS (RDQS_t) signal or a complement RDQS (RDQS_c) signal. In some examples, the memory device may indicate the fault based on a characteristic of the read strobe signal, such as a pattern of the read strobe signal, a voltage level of the read strobe signal, a difference between a first read strobe signal and a second read strobe signal, or any combination thereof. In some examples, a host device may identify a fault type (e.g., recoverable or unrecoverable) based on a fault signature associated with a given characteristic of the read strobe signal. The host device may perform recovery operations based on the fault type identified.

19 Claims, 6 Drawing Sheets

Command Component

525

Read Strobe Signal Component

530

Fault Recovery Component

535

520

500

DIFFERENTIAL STROBE FAULT IDENTIFICATION

CROSS REFERENCE

The present Application for Patent claims the benefit of U.S. Provisional Patent Application No. 63/447,262 by SCHAEFER et al., entitled "DIFFERENTIAL STROBE FAULT IDENTIFICATION," filed Feb. 21, 2023, assigned to the assignee hereof, and expressly incorporated by reference in its entirety herein.

TECHNICAL FIELD

The following relates to one or more systems for memory, including differential strobe fault identification.

BACKGROUND

Memory devices are widely used to store information in devices such as computers, user devices, wireless communication devices, cameras, digital displays, and others. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, the memory device may read (e.g., sense, detect, retrieve, determine) states from the memory cells. To store information, the memory device may write (e.g., program, set, assign) states to the memory cells.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

DETAILED DESCRIPTION

Figure 1:
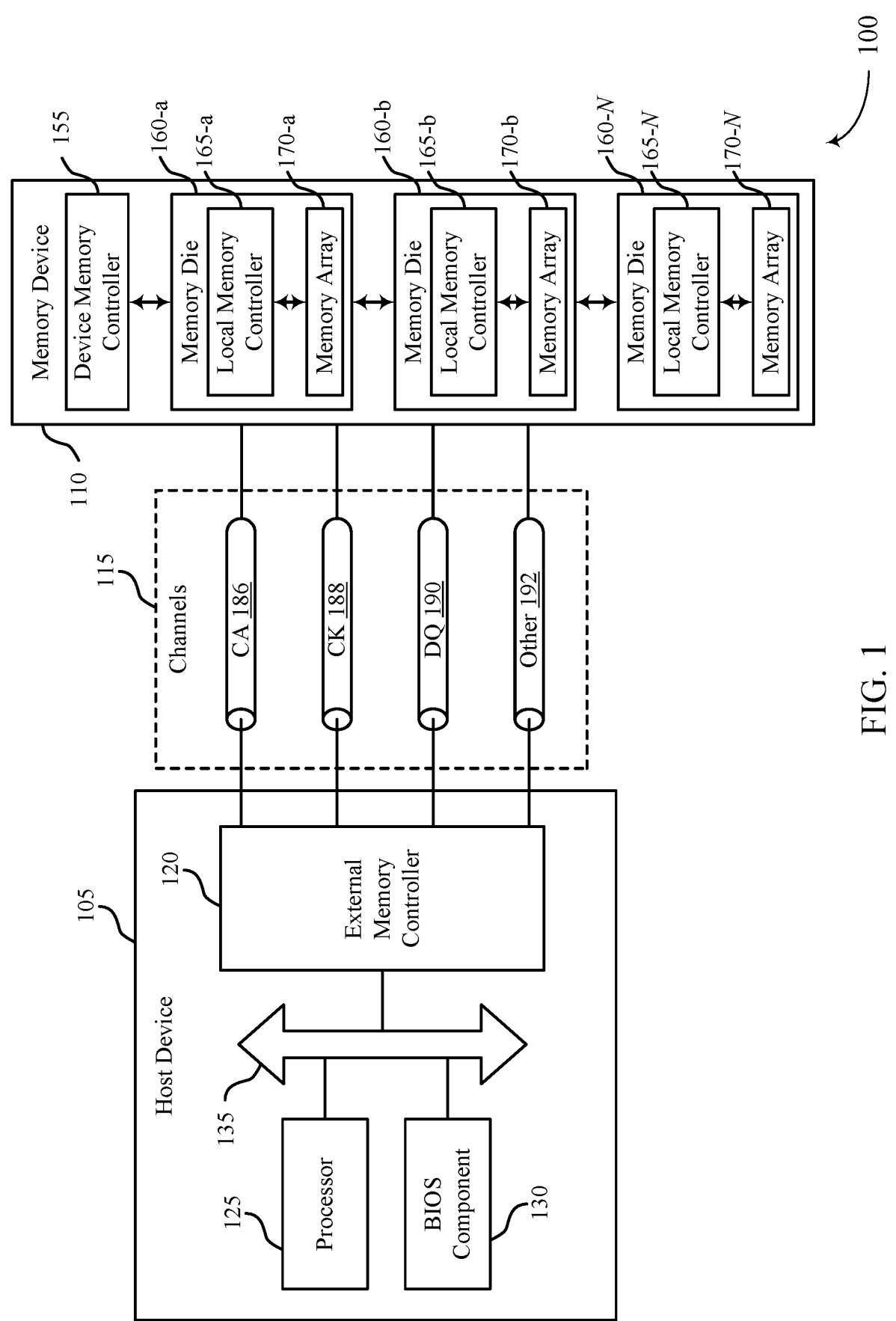
FIG. 1 illustrates an example of a system that supports differential strobe fault identification in accordance with examples as disclosed herein.

A system may include a memory device and a host device, which may communicate with one another using a bus. Different packages (e.g., packages that vary in size, density, architecture, other aspects, or any combination thereof) may be used to contain a memory device. A package that contains a memory device may include multiple pins that are coupled with the bus and provide access to and from components within the memory device. In some examples, one or more of the pins may be coupled with data lines of the bus and one or more of the pins may be coupled with control lines of the bus. Although the systems, methods, and techniques herein are described using pins, it is to be understood that the term pins may refer to other types of connections to a memory device such as balls (e.g., solder balls), posts, or other types of interconnection used for coupling a memory device with a bus.

In some cases, a fault at the memory device may affect reliability of the system. The fault may be associated with operations (e.g., access operations) on a memory array of the memory device. For example, an application (e.g., a functional safety application or a high reliability, availability, and serviceability (RAS) application) at the host device may request notification of memory faults. However, in some systems, including a system that includes a low power dynamic random access memory (LPDRAM) device, the system may not include a dedicated pin for flagging or indicating a fault or an error at the memory device. It may be beneficial to configure the memory device to indicate faults to the host device using one or more existing pins of the system. Additionally it may be beneficial for the host device to identify a type of fault based on the one or more indications from the memory device.

As described herein, a memory device may be configured to indicate a fault using a strobe signal, such as a read strobe signal that may include a true and compliment signal. The memory device may receive (e.g., from a host device) one or more commands to perform operations (e.g., access operations, such as read operations or write operations) on a memory array of the memory device. The memory device may determine or identify a fault associated with performing the operations. The memory device may be configured to output data associated with the commands using a set of data signals (e.g., DQ pins). The memory device may indicate a set of clock cycles for which the data is output for the command using a first strobe signal. The memory device may additionally indicate the fault using a second read strobe signal, for example, as configured by the host device.

The read strobe signals may include read data strobe (RDQS) signals, such as a true RDQS (RDQS_t) signal or a complement RDQS (RDQS_c) signal. In some examples, the memory device may indicate the fault based on a characteristic of the read strobe signal, such as a pattern of the read strobe signal, a voltage level of the read strobe signal, a difference between a first read strobe signal and a second read strobe signal, or any combination thereof. In some examples, a host device may indicate to the memory device which characteristic of the read strobe signal the memory device is to use to indicate the fault type. For example, the host device may identify a fault signature associated with receiving the RDQSs, where the fault signature may indicate a type of fault associated with the read strobe signal (e.g., a recoverable fault or an unrecoverable fault). Additionally, the host device may perform one or more operations based on the type of fault identified from the fault signature. Thus, using the read strobe signal to indicate a fault improves reliability of memory operations at the memory device and increases efficiencies at the host device for resolving the identified faults.

Features of the disclosure are initially described in the context of systems and dies as described with reference to FIGS. 1 and 2. Features of the disclosure are described in the context of timing diagrams as described with reference to FIGS. 3 through 4. These and other features of the disclosure are further illustrated by and described with reference to an apparatus diagram and flowcharts that relate to differential strobe fault identification as described with reference to FIGS. 5 through 6.

FIG. 1 illustrates an example of a system 100 that supports differential strobe fault identification in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or any combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type device to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or any combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-*a*, memory die 160-*b*, memory die 160-N) may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory.

The device memory controller 155 may include components (e.g., circuitry, logic) operable to control operation of the memory device 110. The device memory controller 155 may include hardware, firmware, or instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may communicate information (e.g., data, commands, or both) with the host device 105. For example, the memory device 110 may receive a write command indicating that the memory device 110 is to store data received from the host device 105, or receive a read command indicating that the memory device 110 is to provide data stored in a memory die 160 to the host device 105, among other types of information communication.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or any combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or any combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any quantity of signal paths (e.g., eight or nine signal paths) to communicate control information (e.g., commands or addresses).

In some examples, clock signal channels 188 may be operable to communicate one or more clock signals between the host device 105 and the memory device 110. Clock signals may be operable to oscillate between a high state and a low state, and may support coordination (e.g., in time) between actions of the host device 105 and the memory device 110. In some examples, the clock signal may be single ended. In some examples, the clock signal may provide a timing reference for command and addressing operations for the memory device 110, or other system-wide operations for the memory device 110. A clock signal may be referred to as a control clock signal, a command clock signal, or a system clock signal. A system clock signal may be generated by a system clock, which may include one or more hardware components (e.g., oscillators, crystals, logic gates, transistors).

In some examples, data channels 190 may be operable to communicate information (e.g., data, control information) between the host device 105 and the memory device 110. For example, the data channels 190 may communicate information (e.g., bi-directional) to be written to the memory device 110 or information read from the memory device 110.

The channels 115 may include any quantity of signal paths (including a single signal path). In some examples, a channel 115 may include multiple individual signal paths. For example, a channel may be ×4 (e.g., including four signal paths), ×8 (e.g., including eight signal paths), ×16 (including sixteen signal paths), etc.

In some examples, the one or more other channels 192 may include one or more error detection code (EDC) channels. The EDC channels may be operable to communicate error detection signals, such as checksums, to improve system reliability. An EDC channel may include any quantity of signal paths.

As described herein, the memory device 110 may be configured to indicate a fault using a read strobe signal (e.g., an RDQS signal), which may be communicated using one or more channels 115. In some examples, the memory device 110 may indicate the fault based on a characteristic of the read strobe signal, such as a pattern of the read strobe signal, a voltage level of the read strobe signal, a difference between a first read strobe signal and a second read strobe signal, or any combination thereof. In some examples, the host device 105 may indicate to the memory device 110 which characteristic of the read strobe signal the memory device 110 is to use to indicate the fault type. For example, the host device 105 may identify a fault signature associated with receiving the RDQS signals, where the fault signature may indicate a type of fault associated with the read strobe signal (e.g., a recoverable fault or an unrecoverable fault). Additionally, the host device 105 may perform one or more operations based on the type of fault identified from the fault signature.

Figure 2:
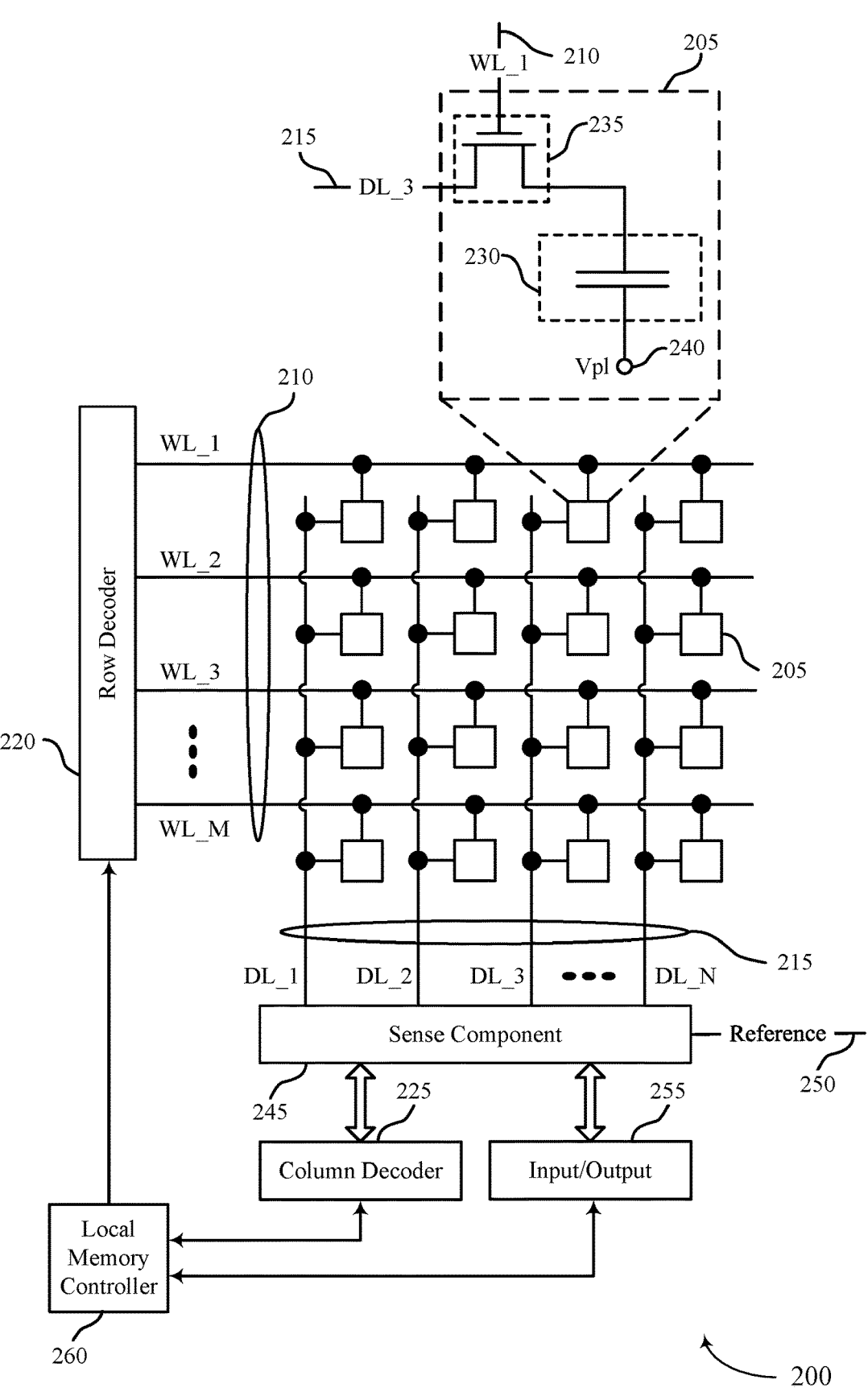
FIG. 2 illustrates an example of a memory die that supports differential strobe fault identification in accordance with examples as disclosed herein.

FIG. 2 illustrates an example of a memory die 200 that supports differential strobe fault identification in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some examples, a memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235 (e.g., a cell selection component). The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include access lines (e.g., word lines 210, digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding. Memory cells 205 may be positioned at intersections of the word lines 210 and the digit lines 215.

Operations such as reading and writing may be performed on the memory cells 205 by activating access lines such as a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in a two-dimensional or in a three-dimensional configuration may be referred to as an address of a memory cell 205. Activating a word line 210 or a digit line 215 may include applying a voltage to the respective line.

Accessing the memory cells 205 may be controlled through a row decoder 220, or a column decoder 225, or any combination thereof. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

A word line 210 may be a conductive line in electronic communication with a memory cell 205 that is used to perform access operations on the memory cell 205. In some architectures, the word line 210 may be coupled with a gate of a switching component 235 of a memory cell 205 and may be operable to control the switching component 235 of the memory cell. In some architectures, the word line 210 may be coupled with a node of the capacitor of the memory cell 205 and the memory cell 205 may not include a switching component.

A digit line 215 may be a conductive line that couples the memory cell 205 with a sense component 245. In some architectures, the memory cell 205 may be selectively coupled with the digit line 215 during portions of an access operation. For example, the word line 210 and the switching component 235 of the memory cell 205 may be operable to couple or isolate the capacitor 230 of the memory cell 205 and the digit line 215. In some architectures, the memory cell 205 may be coupled with the digit line 215.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device (e.g., a memory device 110) that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host (e.g., a host device 105) based on performing the one or more operations. The local memory controller 260 may generate row signals and column address signals to activate the target word line 210 and the target digit line 215. The local memory controller 260 also may generate and control various signals (e.g., voltages, currents) used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired state (e.g., logic state, charge state). The local memory controller 260 may identify a target memory cell 205 on which to perform the write operation. The local memory controller 260 may identify a target word line 210 and a target digit line 215 coupled with the target memory cell 205 (e.g., an address of the target memory cell 205). The local memory controller 260 may activate the target word line 210 and the target digit line 215 (e.g., applying a voltage to the word line 210 or digit line 215) to access the target memory cell 205. The local memory controller 260 may apply a signal (e.g., a write pulse, a write voltage) to the digit line 215 during the write operation to store a specific state (e.g., charge) in the capacitor 230 of the memory cell 205. The signal used as part of the write operation may include one or more voltage levels over a duration.

The local memory controller 260 may be operable to perform a read operation (e.g., a sense operation) on one or more memory cells 205 of the memory die 200. During a read operation, the state (e.g., logic state, charge state) stored in a memory cell 205 of the memory die 200 may be evaluated (e.g., read, determined, identified). The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The target memory cell 205 may transfer a signal (e.g., charge, voltage) to the sense component 245 in response to biasing the access lines. The sense component 245 may amplify the signal. The local memory controller 260 may activate the sense component 245 (e.g., latch the sense component) and compare the signal received from the memory cell 205 to a reference (e.g., the reference 250). Based on that comparison, the sense component 245 may determine a logic state that is stored on the memory cell 205.

A package may be used to contain and provide access to and from a memory device, such as the memory device 110 in FIG. 1, which may include a memory die 200. The package may include pins that give access to and from components within the memory device 110, such as the memory die 200. For example, a memory controller (e.g., a device memory controller 155 in FIG. 1, a local memory controller 165 in FIG. 1, the local memory controller 260) in the memory device may be coupled with a set of DQ pins that allow data to be inputted to or outputted from the memory controller. The package may also include an RDQS pin that is used by the memory controller to output a clock signal (e.g., an RDQS signal) for sampling a data signal on the DQ pins—e.g., when the memory device is configured to operate using a frequency that falls within a range of frequencies. Also, the package may include a data mask inversion (DMI) pin that is used to output error management information—e.g., information for detecting and/or correcting errors.

The pins of the package may also be coupled with a bus (or transmission bus) that includes lines (or transmission lines). The bus may be used to provide a communicative path between the memory device and a host device (e.g., host device 105 of FIG. 1). The transmission lines of the bus may include data lines and control lines. In some examples, the DQ pins may be coupled with data lines of the bus, the RDQS pin may be coupled with a control (or clock) line of the bus, and the DMI pin may be coupled with a control line of the bus. In some examples, the pins of the package and/or the transmission lines of the bus may be terminated (e.g., weakly) to a voltage source or voltage sink (e.g., a ground reference). Thus, when the bus is not being used (e.g., is in an idle, inactive, or floating state), the voltage of the pins and transmission lines may trend toward the voltage of the voltage source or voltage sink. Alternatively, when the bus is being used (e.g., is in an active state) by either the memory device or the host device, the voltage of the transmission lines may be driven by the memory device or the host device.

In some examples, unit intervals of a read operation may be determined based on a read clock signal (which may include one or more read strobe signals) output on the RDQS pin, where each unit interval may correspond to the duration between a falling edge of a read clock and a subsequent rising edge of the read clock. The read data signal may be aligned with the outputting of data bits on the DQ pins. In some examples, the read clock may be output by the memory device when the memory device is operated within a particular frequency range. When operating outside of the frequency range, the memory device may not output the read clock signal. In such cases, the unit intervals may be determined based on a write clock (WCK) signal generated at the host device. In some examples, the RDQS signal may be generated using differential signals that correspond to a WCK signal received from the host device (which may be referred to as a differential strobe technique or a differential mode). For example, the RDQS signal may be generated using an inverted and non-inverted version of the WCK signal, which may correspond to an RDQS_c signal and an RDQS_t signal, respectively. In other examples, the RDQS signal may be generated using the non-inverted version of a WCK signal received from the host device (which may be referred to as a single-ended strobe technique or a single-ended mode).

As described herein, the memory device may be configured to indicate a fault using a read strobe signal. In some examples, the memory device may indicate the fault based on a characteristic of the read strobe signal, such as a pattern of the read strobe signal, a voltage level of the read strobe signal, a difference between a first read strobe signal and a second read strobe signal, or any combination thereof. In some examples, a host device may indicate to the memory device which characteristic of the read strobe signal the memory device is to use to indicate the fault type. For example, the host device may identify a fault signature associated with receiving the RDQS signals, where the fault signature may indicate a type of fault associated with the read strobe signal (e.g., a recoverable fault or an unrecoverable fault). Additionally, the host device may perform one or more operations based on the type of fault identified from the fault signature.

Figure 3:
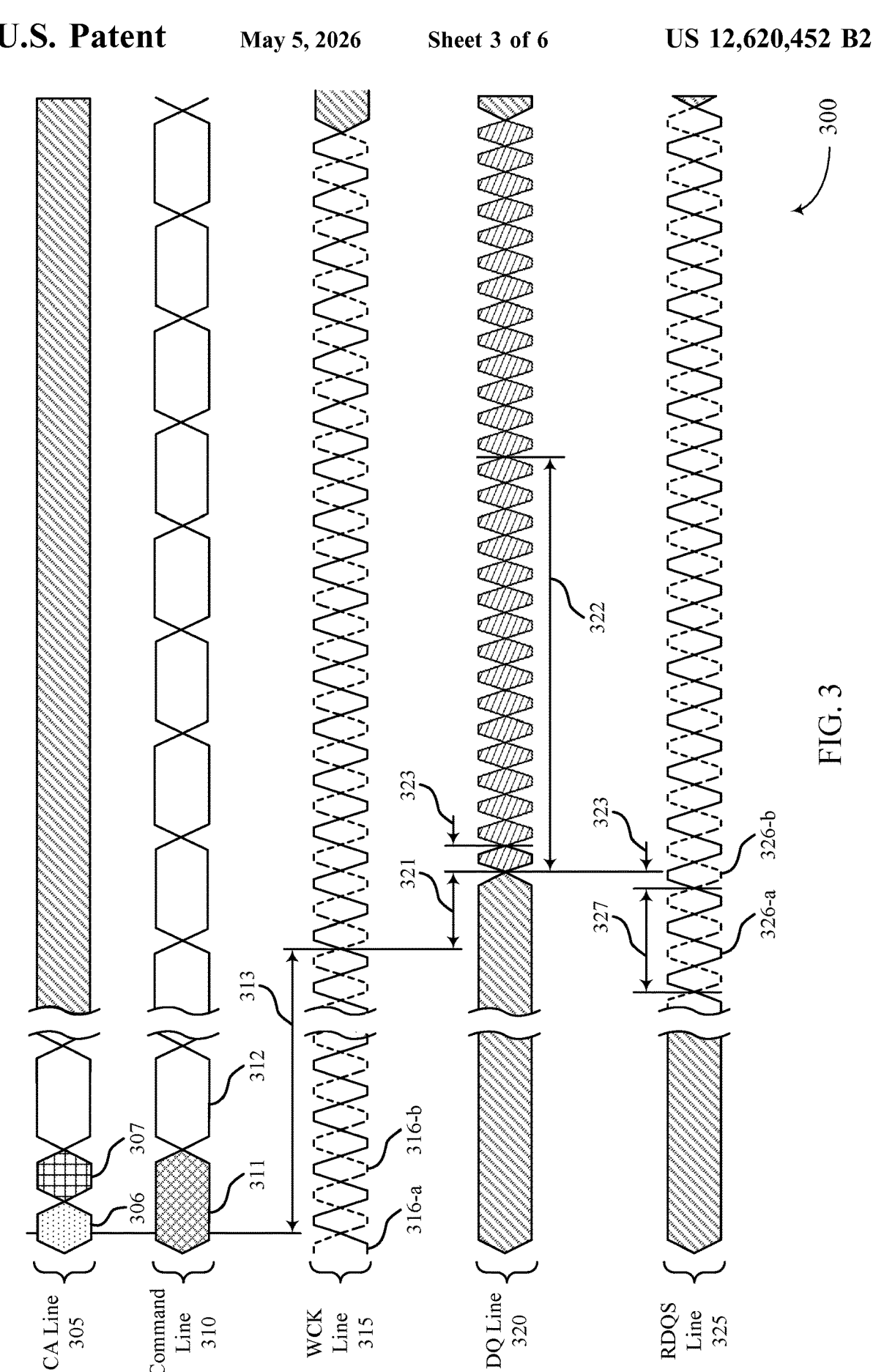
FIG. 3 illustrates an example of a timing diagram that supports differential strobe fault identification in accordance with examples as disclosed herein.

FIG. 3 illustrates an example of a timing diagram 300 that supports differential strobe fault identification in accordance with examples as disclosed herein. Timing diagram 300 depicts an exchange of signaling between a host device and a memory device, which may be examples of a host device and memory device described in FIGS. 1 and 2. Timing diagram 300 may depict signals that may be transmitted over one or more lines of a bus, including a CA line 305, a command line 310, a WCK line 315, a DQ line 320, and an RDQS line 325, among other lines. In some examples, the CA line 305 and the command line 305 may be examples of CA channels 186, the WCK line 315 and the RDQS line 325 may be examples of CK channels 188, and the DQ line may be an example of a DQ channel 190 as described with reference to FIG. 1.

In some examples, timing diagram 300 may depict an exemplary read operation between a host device and a memory device. To initiate the read operation, the host device may transmit, to the memory device via the command line 310, a read command 311 requesting data 322 stored in a memory array. Concurrent with the read command 311, the host device may transmit a validation signal 306 and a bank group signal 307 via the CA line 305 to validate the read command 311 and identify a bank group associated with the requested data 322. After successfully receiving and/or decoding the read command 311, the memory device may initiate a sequence of operations for outputting the data 322 requested by the read command 311. In such cases, the memory device may retrieve data and error management information (e.g., parity bits) from one or more memory locations addressed by the read command 311.

In some examples, the host device may transmit (e.g., issue), via the command line 310, a quantity of deselect commands 312 (which may be referred to as a DES command, a DSEL command, a device deselect command, or a command inhibit command) between activation or data access commands to satisfy timing constraints, such as a read latency 313 (which may be referred to as RL or $t_{RL}$) associated with performing the sequence of operations for outputting the data 322. In some examples, the read latency 313 may correspond to a quantity of clock cycles of a WCK signal 316 on the WCK line 315. For example, the host device may transmit, via the WCK line 315, a WCK signal 316-a (which may be referred to as a true WCK (WCK_t) signal) and a WCK signal 316-b, which may be an inverted version of the WCK signal 316-a and which may be referred to as a complement WCK (WCK_c) signal.

The memory device may output the data 322 requested by the read command 311 via the DQ line 320. The memory device may also output read strobe signals 326 over the RDQS line 325 of the bus, where the read strobe signals 326 may be used to synchronize a sampling of the DQ line 320 at the host device with an output of the data 322 from the memory device. For example, the memory device may output a read strobe signal 326-a to indicate clock cycles for outputting the requested data 322 via the DQ line 320. In some examples, a new subset of the requested data is output on a rising edge of the read strobe signal 326-a and a falling edge of the read strobe signal 326-a.

Each rising and falling edge of the read strobe signal 326-a may be associated with a unit interval 323 (which may be referred to as $t_{DQSQ}$) of the data output operation. In some examples, the unit intervals 323 for outputting the data on the DQ line 320 may be offset from clock cycles of the WCK signal 316-a by a read response timing 321, which may be referred to as $t_{WCK2DQO}$. In some examples, the memory device may output the read strobe signal 326-a for a read preamble duration 327, which may be referred to as $t_{RPRE}$. The read preamble duration may include a quantity of clock cycles (e.g., 2 clock cycles, 4 clock cycles) that indicate to the host device that the requested data 322 is upcoming on the DQ line 320.

In some examples (e.g., when using a differential strobe technique or a differential mode), a read clock signal output on the RDQS line 325 may be generated using an inverted and non-inverted version of the WCK signal 316-a, which may correspond to an RDQS_c signal (e.g., a read strobe signal 326-b) and an RDQS_t signal (e.g., the read strobe signal 326-a), respectively. In other examples, a read clock signal may be generated using the non-inverted version of the WCK signal 316-a received from the host device (which may be referred to as a single-ended strobe technique or a single-ended mode).

As described herein, the memory device may be configured to indicate a fault using one or more read strobe signals 326. In some examples, the memory device may indicate the fault based on a characteristic of a read strobe signal 326, such as a pattern of a read strobe signal 326, a voltage level of a read strobe signal 326, a difference between the read strobe signal 326-a and the read strobe signal 326-b, or any combination thereof. In some examples, such as when the read clock signal is generated using a single-ended mode, the memory device may indicate the fault using a read strobe signal 326 that is not used to generate the read clock signal. For example, if an RDQS_t signal (e.g., the read strobe signal 326-a) is enabled to perform an RDQS strobe function (e.g., as part of a write link ECC function) and an RDQS_c signal (e.g., the read strobe signal 326-b) is not strobing data to the host device, the RDQS_c signal may be available to indicate the fault. In some cases, the RDQS_c signal may indicate the fault concurrent with a clock cycle of a data signal (e.g., DQ) that is associated with the fault. Alternatively, the read clock signal may be generated using a differential mode, using the RDQS_c signal and the RDQS_t signal. In such cases, either or both of the RDQS_c signal or the RDQS_t signal may be used to indicate the fault, and may indicate the fault concurrent with a clock cycle of a data signal (e.g., DQ) that is associated with the fault. In some examples, a host device may indicate to the memory device which characteristic of the read strobe signal 326 the memory device is to use to indicate the fault. Thus, using the read strobe signal 326 to indicate a fault improves reliability of memory operations at the memory device.

In some examples, the characteristic of the read strobe signal used may be associated with a type of fault. For example, a recoverable fault type may be associated with a first characteristic of the set of characteristics (e.g., one or more of a pattern of a read strobe signal 326, a voltage level of a read strobe signal 326, a difference between the read strobe signal 326-*a* and the read strobe signal 326-*b*). As such, the host device may identify a fault signature based on the read strobe signal 326 corresponding to the first characteristic, where the fault signature may indicate a recoverable fault type.

Additionally or alternatively, an unrecoverable fault type may be associated with a second characteristic of the set of characteristics (e.g., one or more of a pattern of a read strobe signal 326, a voltage level of a read strobe signal 326, a difference between the read strobe signal 326-*a* and the read strobe signal 326-*b*). As such, the host device may identify a fault signature based on the read strobe signal 326 corresponding to the second characteristics, where the fault signature may indicate an unrecoverable fault type.

Based on the type of fault identified (e.g., recoverable, or unrecoverable) from the read strobe signal, the host device may perform one or more recovery operations. Further discussion of performing the one or more recovery operations are described herein, including with reference to FIG. 4.

Figure 4:
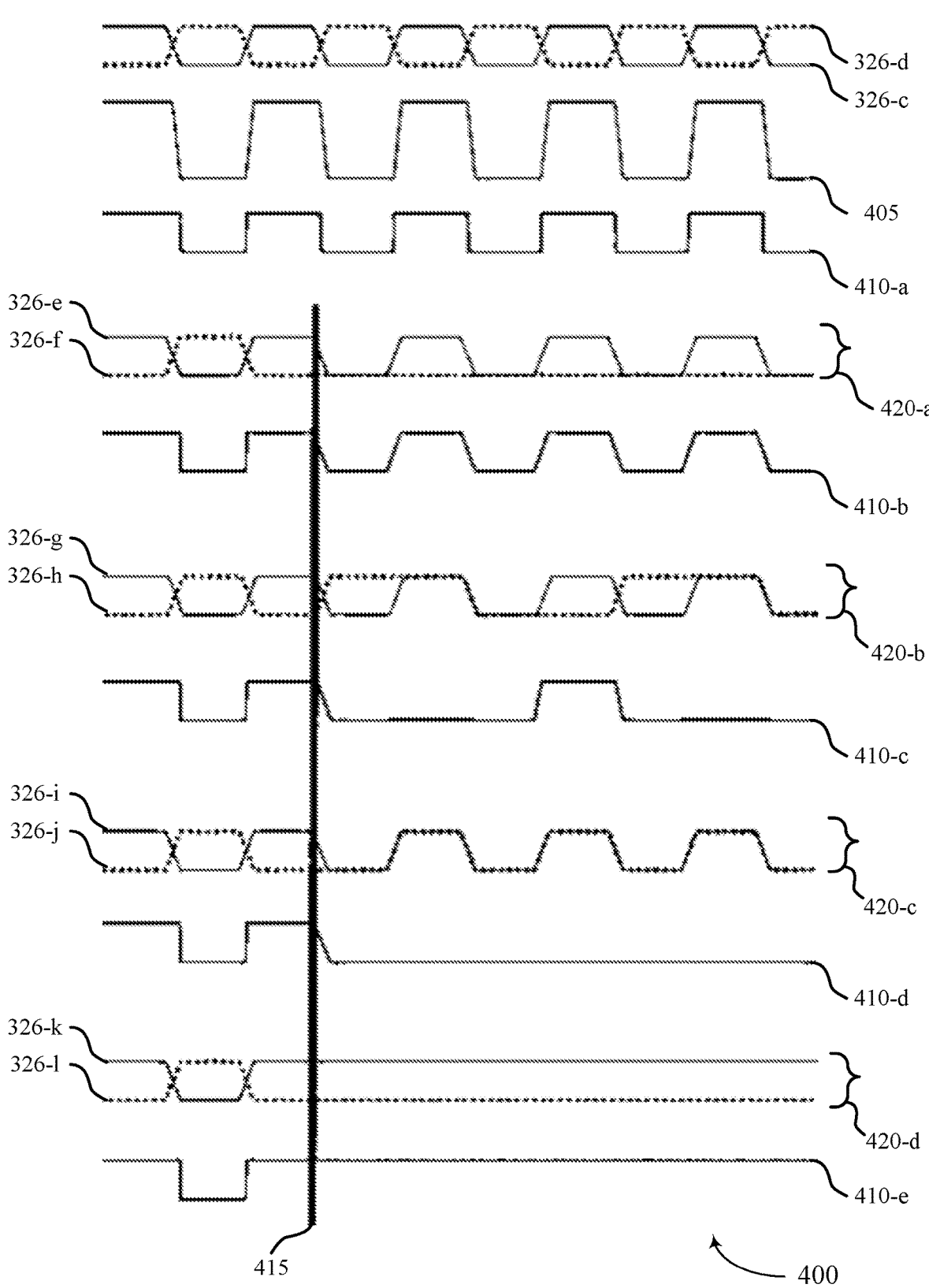
FIG. 4 illustrates an example of a timing diagram that supports differential strobe fault identification in accordance with examples as disclosed herein.

FIG. 4 illustrates an example of a timing diagram 400 that supports differential strobe fault identification in accordance with examples as disclosed herein. Timing diagram 400 depicts examples of exchanges of signaling between a host device and a memory device, which may be examples of a host device and memory device described in FIGS. 1 and 2.

Timing diagram 400 depicts example read strobe signals 326 (e.g., RDQS signals) that may be transmitted over one or more data lines of a bus from the memory device to the host device. In some examples, the host device may capture a differential signal 405 (e.g., a read clock signal) based on a difference between two read strobe signals 326-*c* and 326-*d* that are inverted (e.g., have a phase offset of 180°) relative to one another, and the differential signal 405 may be converted to an internal strobe signal 410-*a*. The host device may use the internal strobe signal 410-*a* to identify clock cycles for capturing read data output by the memory device, for example in response to a read command as described with reference to FIG. 3.

In some cases, the memory device may determine or identify a fault associated with performing operations (e.g., access operations) at the memory device based on commands from the host device. Accordingly, in addition to indicating read data using a first read strobe signal 326, the memory device may be configured to indicate the fault using a second read strobe signal 326 beginning at a time 415. For example, the first read strobe signal 326 may be an RDQS_t signal, and the second read strobe signal 326 may be an RDQS_c signal (or vice versa). In some examples, the time 415 may correspond to a time following an indication of the data output. For example, the memory device may indicate the fault after a quantity of cycles corresponding to a read preamble indicating the presence of the data on a DQ line. In some examples, the time 415 may correspond to a time outside a duration associated with the data output.

Additionally, or alternatively, the time 415 may be based on when the memory device detects the fault. For example, the memory device may indicate the fault concurrent with a clock cycle of the DQ line associated with the fault. In some examples, the memory device may indicate the fault outside of the clock cycles of the DQ line (e.g., used for read operation or operations other than read operations). Based on an internal strobe signal 410 being generated in accordance with the first and second read strobe signals 326, the host device may identify the fault at the memory device. Thus, using the read strobe signals 326 to indicate the fault improves reliability of memory operations at the memory device.

In some examples, to indicate the fault, the memory device may output a steady voltage level on a read strobe signal 326-*f* (e.g., drive the read strobe signal 326-*f* at a steady voltage, such as a low voltage) while outputting a read data pulse on a read strobe signal 326-*e*. Thus, based on an internal strobe signal 410-*b* generated based on the read strobe signals 326-*e* and 326-*f*, the host device may detect the read data while also identifying the fault indicated by the memory device.

In some examples, to indicate the fault, the memory device may output a read data pulse on a read strobe signal 326-*h* according to a periodicity that is different than a periodicity of a read data pulse output on a read strobe signal 326-*g*. For example, the memory device may toggle the read strobe signal 326-*g* between a first voltage level and a second voltage level according to a first periodicity, and toggle the read strobe signal 326-*h* between the first and second voltage levels according to a second periodicity. The memory device may indicate the fault based on a difference between the first and second periodicities, and the host device may identify the fault based on an internal strobe signal 410-*c* that is generated based on the read strobe signals 326-*g* and 326-*h*.

In some examples, to indicate the fault, the memory device may output a read data pulse on a read strobe signal 326-*i* that is in phase (or has a phase offset other than 180°) relative to a read data pulse output on a read strobe signal 326-*j*. For example, the memory device may toggle the read strobe signal 326-*i* between a first voltage level and a second voltage level according to a first periodicity, and toggle the read strobe signal 326-*j* between the first and second voltage levels according to the same first periodicity. The memory device may indicate the fault based on the read strobe signals 326-*i* and 326-*j* being in phase, and the host device may identify the fault based on an internal strobe signal 410-*d* that is generated based on the read strobe signals 326-*i* and 326-*j*. That is, the internal strobe signal 410-*d* may be a steady state voltage (e.g., a zero voltage) based on the read strobe signals 326-*i* and 326-*j* being in phase, and the host device may readily detect the in-phase read strobe signals 326-*i* and 326-*j*.

In some examples, to indicate the fault, the memory device may output a first voltage level (e.g., a steady voltage level having a first polarity) using a read strobe signal 326-*k* and output a second voltage level (e.g., a steady voltage level having a second polarity) using a read strobe signal 326-1. The memory device may indicate the fault based on a difference between the first and second voltage levels, and the host device may identify the fault based on an internal strobe signal 410-*e* that is generated based on the read strobe signals 326-*k* and 326-1. That is, the internal strobe signal 410-*e* may be a steady state voltage based on the difference between the first and second voltage levels.

In some examples, the memory device may indicate the fault using the read strobe signals 326 (e.g., drive a fault flag condition using the read strobe signals 326) for a configured duration (e.g., beginning at the time 415). For example, the memory device may indicate the fault according to a defined or programmed timeout, or until the host device acknowledges the fault indication. Additionally, or alternatively, the host device may indicate to the memory device which faults (e.g., which types of faults) are configured to trigger the fault indication.

As such, the host device may receive a given internal strobe signal 410. In some examples, each of the internal strobe signals 410 used to indicate a fault (e.g., internal strobe signals 410-*b* through 410-*e*) may each be associated with a respective fault signature 420, where a given fault signature 420 may indicate a fault type from a set of fault types. For example, a first fault signature 420 may be associated with indicating the fault type as a recoverable fault and a second fault signature 420 may be associated with indicating the fault type as an unrecoverable fault. In some cases, one or more of the internal strobe signals 410 may be configured to indicate a recoverable fault while the remaining internal strobe signals may be configured to indicate an unrecoverable fault. Additionally or alternatively, one or more of fault signatures 420 may be configured to indicate types of recoverable faults, while others of fault signatures 420 may be configured to indicate types of unrecoverable faults. For instance, internal strobe signals 410-*b* and 410-*c* corresponding to fault signatures 420-*a* and 420-*b* may be configured to indicate recoverable faults (e.g., first and second types of recoverable faults) to the host device and internal strobe signals 410-*d* and 410-*e* corresponding to fault signatures 420-*c* and 420-*d* may be configured to indicate unrecoverable faults (e.g., first and second types of unrecoverable faults) to the host device, or some other configuration. Thus, the memory device may indicate a first fault using a fault signature 420 corresponding to a recoverable fault (e.g., fault signature 420-*a* or fault signature 420-*b*), and may, subsequently (e.g., as part of executing a subsequent command), indicate a second fault using a fault signature 420 corresponding to a different recoverable fault, or an unrecoverable fault (e.g., fault signature 420-*c* or fault signature 420-*d*).

In some cases, the type of fault indicated by each fault signature 420 (e.g., and internal strobe signal 410) may be preconfigured at the memory device and host device. In some cases, the host device may indicate to the memory device which of the fault signatures 420 are configured to indicate a recoverable fault and which of the fault signatures 420 are configured to indicate an unrecoverable fault.

Based on the type of fault indicated (e.g., recoverable, or unrecoverable) by the received fault signature 420, the host device may perform one or more recovery operations. In some examples, the memory device may store a type of the fault in one or more registers (e.g., mode registers) upon indicating the fault (e.g., recoverable fault). The host device may identify that the fault type indicated by the fault signature associated with the fault signature is a recoverable fault. As such, the host device may read the one or more registers of the memory device (e.g., mode registers) based on identifying the recoverable fault. The host device may use the one or more registers to identify the cause of the recoverable fault, and perform the one or more recovery operations in accordance with resolving the cause of the recoverable fault.

In some examples, the host device may identify that the fault type indicated by the fault signature 420 is an unrecoverable fault. As such, the host device may transition the system to a safe state mode based on identifying the unrecoverable fault.

Figure 5:
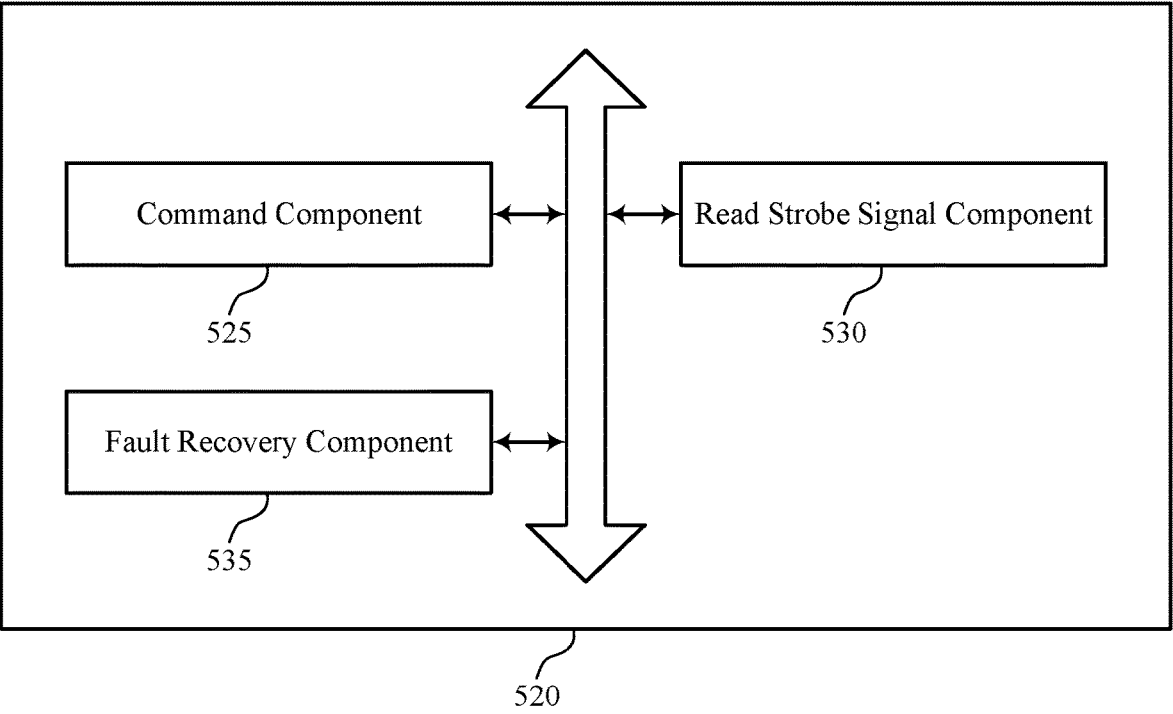
FIG. 5 illustrates a block diagram of a host device that supports differential strobe fault identification in accordance with examples as disclosed herein.
Figure 5:

FIG. 5 illustrates a block diagram 500 of a host device 520 that supports differential strobe fault identification in accordance with examples as disclosed herein. The host device 520 may be an example of aspects of a host device as described with reference to FIGS. 1 through 4. The host device 520, or various components thereof, may be an example of means for performing various aspects of differential strobe fault identification as described herein. For example, the host device 520 may include a command component 525, a read strobe signal component 530, a fault recovery component 535, or any combination thereof. Each of these components may communicate, directly or indirectly, with one another (e.g., via one or more buses).

The command component 525 may be configured as or otherwise support a means for transmitting, to a memory device, one or more commands to perform one or more operations on a memory array of the memory device. The read strobe signal component 530 may be configured as or otherwise support a means for identifying a plurality of clock cycles for receiving data from the memory device associated with a first command of the one or more commands based at least in part on a first read strobe signal of a set of read strobe signals. In some examples, the read strobe signal component 530 may be configured as or otherwise support a means for identifying a fault signature based at least in part on a second read strobe signal of the set of read strobe signals, the fault signature indicating a fault type from a plurality of fault types corresponding to different fault signatures associated with characteristics of the second read strobe signal relative to the first read strobe signal. The fault recovery component 535 may be configured as or otherwise support a means for performing one or more recovery operations based at least in part on the fault type indicated by the fault signature.

In some examples, the fault recovery component 535 may be configured as or otherwise support a means for identifying that the fault type indicated by the fault signature is a recoverable fault. In some examples, the fault recovery component 535 may be configured as or otherwise support a means for reading one or more registers based at least in part on identifying the recoverable fault. In some examples, the fault recovery component 535 may be configured as or otherwise support a means for identifying a cause of the recoverable fault based at least in part on reading the one or more registers, where performing the one or more recovery operations is based at least in part on the cause of the recoverable fault.

In some examples, to support performing the one or more recovery operations, the fault recovery component 535 may be configured as or otherwise support a means for identifying that the fault type indicated by the fault signature is an unrecoverable fault. In some examples, to support performing the one or more recovery operations, the fault recovery component 535 may be configured as or otherwise support a means for transitioning to a safe state mode based at least in part on identifying the unrecoverable fault.

In some examples, the read strobe signal component 530 may be configured as or otherwise support a means for identifying that the second read strobe signal outputs a voltage level for a plurality of clock cycles, where the fault type is identified based at least in part on the voltage level.

In some examples, the read strobe signal component 530 may be configured as or otherwise support a means for identifying that the first read strobe signal toggles between a first voltage level and a second voltage level according to a first periodicity, where identifying the plurality of clock cycles for receiving data is based at least in part on identifying the toggling of the first read strobe signal. In some examples, the read strobe signal component 530 may be configured as or otherwise support a means for identifying that the second read strobe signal toggles between the first voltage level and the second voltage level according to a second periodicity, where the fault type is identified based at least in part on a difference between the first periodicity and the second periodicity.

In some examples, the read strobe signal component 530 may be configured as or otherwise support a means for identifying that the first read strobe signal toggles between a first voltage level and a second voltage level according to a first periodicity, where identifying the plurality of clock cycles for receiving data is based at least in part on identifying the toggling of the first read strobe signal. In some examples, the read strobe signal component 530 may be configured as or otherwise support a means for identifying that the second read strobe signal toggles between the first voltage level and the second voltage level according to the first periodicity, where the fault type is identified based at least in part on the second read strobe signal being in phase with the first read strobe signal according to the first periodicity.

In some examples, the read strobe signal component 530 may be configured as or otherwise support a means for identifying that the first read strobe signal outputs a first voltage level for a plurality of clock cycles. In some examples, the read strobe signal component 530 may be configured as or otherwise support a means for identifying that the second read strobe signal outputs a second voltage level for the plurality of clock cycles, where the fault type is identified based at least in part on a difference between the first voltage level and the second voltage level.

Figure 6:
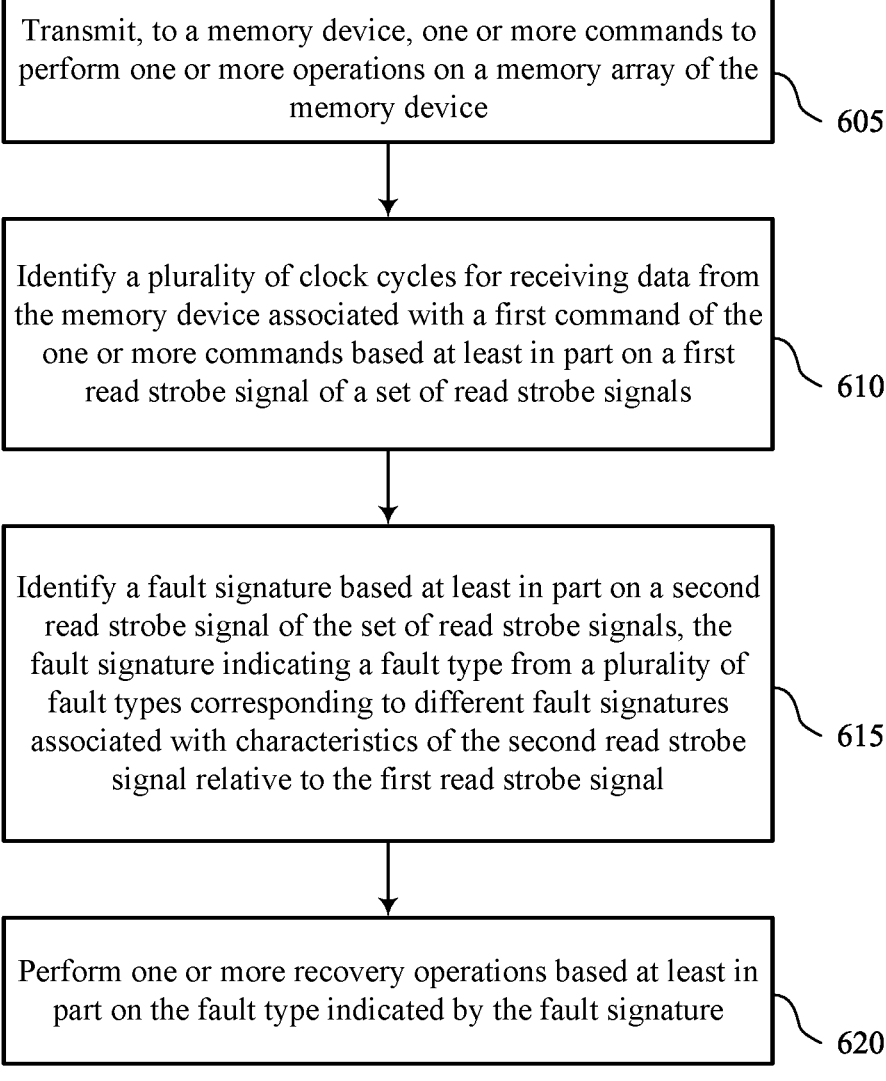
FIG. 6 illustrates a flowchart showing a method or methods that support differential strobe fault identification in accordance with examples as disclosed herein.

FIG. 6 illustrates a flowchart showing a method 600 that supports differential strobe fault identification in accordance with examples as disclosed herein. The operations of method 600 may be implemented by a host device or its components as described herein. For example, the operations of method 600 may be performed by a host device as described with reference to FIGS. 1 through 5. In some examples, a host device may execute a set of instructions to control the functional elements of the device to perform the described functions. Additionally, or alternatively, the host device may perform aspects of the described functions using special-purpose hardware.

At 605, the method may include transmitting, to a memory device, one or more commands to perform one or more operations on a memory array of the memory device. The operations of 605 may be performed in accordance with examples as disclosed herein. In some examples, aspects of the operations of 605 may be performed by a command component 525 as described with reference to FIG. 5.

At 610, the method may include identifying a plurality of clock cycles for receiving data from the memory device associated with a first command of the one or more commands based at least in part on a first read strobe signal of a set of read strobe signals. The operations of 610 may be performed in accordance with examples as disclosed herein. In some examples, aspects of the operations of 610 may be performed by a read strobe signal component 530 as described with reference to FIG. 5.

At 615, the method may include identifying a fault signature based at least in part on a second read strobe signal of the set of read strobe signals, the fault signature indicating a fault type from a plurality of fault types corresponding to different fault signatures associated with characteristics of the second read strobe signal relative to the first read strobe signal. The operations of 615 may be performed in accordance with examples as disclosed herein. In some examples, aspects of the operations of 615 may be performed by a read strobe signal component 530 as described with reference to FIG. 5.

At 620, the method may include performing one or more recovery operations based at least in part on the fault type indicated by the fault signature. The operations of 620 may be performed in accordance with examples as disclosed herein. In some examples, aspects of the operations of 620 may be performed by a fault recovery component 535 as described with reference to FIG. 5.

In some examples, an apparatus as described herein may perform a method or methods, such as the method 600. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for transmitting, to a memory device, one or more commands to perform one or more operations on a memory array of the memory device; identifying a plurality of clock cycles for receiving data from the memory device associated with a first command of the one or more commands based at least in part on a first read strobe signal of a set of read strobe signals; identifying a fault signature based at least in part on a second read strobe signal of the set of read strobe signals, the fault signature indicating a fault type from a plurality of fault types corresponding to different fault signatures associated with characteristics of the second read strobe signal relative to the first read strobe signal; and performing one or more recovery operations based at least in part on the fault type indicated by the fault signature.

Aspect 2: The method, apparatus, or non-transitory computer-readable medium of aspect 1, further including operations, features, circuitry, logic, means, or instructions, or any combination thereof for identifying that the fault type indicated by the fault signature is a recoverable fault; reading one or more registers based at least in part on identifying the recoverable fault; and identifying a cause of the recoverable fault based at least in part on reading the one or more registers, where performing the one or more recovery operations is based at least in part on the cause of the recoverable fault.

Aspect 3: The method, apparatus, or non-transitory computer-readable medium of any of aspects 1 through 2, where performing the one or more recovery operations includes operations, features, circuitry, logic, means, or instructions, or any combination thereof for identifying that the fault type indicated by the fault signature is an unrecoverable fault and transitioning to a safe state mode based at least in part on identifying the unrecoverable fault.

Aspect 4: The method, apparatus, or non-transitory computer-readable medium of any of aspects 1 through 3, further including operations, features, circuitry, logic, means, or instructions, or any combination thereof for identifying that the second read strobe signal outputs a voltage level for a plurality of clock cycles, where the fault type is identified based at least in part on the voltage level.

Aspect 5: The method, apparatus, or non-transitory computer-readable medium of any of aspects 1 through 4, further including operations, features, circuitry, logic, means, or instructions, or any combination thereof for identifying that the first read strobe signal toggles between a first voltage level and a second voltage level according to a first periodicity, where identifying the plurality of clock cycles for receiving data is based at least in part on identifying the toggling of the first read strobe signal and identifying that the second read strobe signal toggles between the first voltage level and the second voltage level according to a second periodicity, where the fault type is identified based at least in part on a difference between the first periodicity and the second periodicity.

Aspect 6: The method, apparatus, or non-transitory computer-readable medium of any of aspects 1 through 5, further including operations, features, circuitry, logic, means, or instructions, or any combination thereof for identifying that the first read strobe signal toggles between a first voltage level and a second voltage level according to a first periodicity, where identifying the plurality of clock cycles for receiving data is based at least in part on identifying the toggling of the first read strobe signal and identifying that the second read strobe signal toggles between the first voltage level and the second voltage level according to the first periodicity, where the fault type is identified based at least in part on the second read strobe signal being in phase with the first read strobe signal according to the first periodicity.

Aspect 7: The method, apparatus, or non-transitory computer-readable medium of any of aspects 1 through 6, further including operations, features, circuitry, logic, means, or instructions, or any combination thereof for identifying that the first read strobe signal outputs a first voltage level for a plurality of clock cycles and identifying that the second read strobe signal outputs a second voltage level for the plurality of clock cycles, where the fault type is identified based at least in part on a difference between the first voltage level and the second voltage level.

It should be noted that the methods described herein describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, or symbols of signaling that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current, voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" (e.g., "electrically coupling") may refer to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, at a host device, comprising:
   transmitting, to a memory device, one or more commands to perform one or more operations on a memory array of the memory device;
   identifying a plurality of clock cycles for receiving data from the memory device associated with a first command of the one or more commands based at least in part on a first read strobe signal of a set of read strobe signals;
   identifying a fault signature based at least in part on a second read strobe signal of the set of read strobe signals, the fault signature indicating a fault type from a plurality of fault types corresponding to different fault signatures associated with characteristics of the second read strobe signal relative to the first read strobe signal, wherein the fault type is a recoverable fault or an unrecoverable fault; and
   performing one or more recovery operations based at least in part on the fault type indicated by the fault signature.

2. The method of claim 1, further comprising:
   identifying that the fault type indicated by the fault signature is the recoverable fault;
   reading one or more registers based at least in part on identifying the recoverable fault; and
   identifying a cause of the recoverable fault based at least in part on reading the one or more registers, wherein performing the one or more recovery operations is based at least in part on the cause of the recoverable fault.

3. The method of claim 1, wherein the fault type indicated by the fault signature is the unrecoverable fault, wherein performing the one or more recovery operations comprises:
identifying that the fault type indicated by the fault signature is the unrecoverable fault; and
transitioning to a safe state mode based at least in part on identifying the unrecoverable fault.

4. The method of claim 1, further comprising:
identifying that the second read strobe signal outputs a voltage level for a plurality of clock cycles, wherein the fault type is identified based at least in part on the voltage level.

5. The method of claim 1, further comprising:
identifying that the first read strobe signal toggles between a first voltage level and a second voltage level according to a first periodicity, wherein identifying the plurality of clock cycles for receiving data is based at least in part on identifying the toggling of the first read strobe signal; and
identifying that the second read strobe signal toggles between the first voltage level and the second voltage level according to a second periodicity, wherein the fault type is identified based at least in part on a difference between the first periodicity and the second periodicity.

6. The method of claim 1, further comprising:
identifying that the first read strobe signal toggles between a first voltage level and a second voltage level according to a first periodicity, wherein identifying the plurality of clock cycles for receiving data is based at least in part on identifying the toggling of the first read strobe signal; and
identifying that the second read strobe signal toggles between the first voltage level and the second voltage level according to the first periodicity, wherein the fault type is identified based at least in part on the second read strobe signal being in phase with the first read strobe signal according to the first periodicity.

7. The method of claim 1, further comprising:
identifying that the first read strobe signal outputs a first voltage level for a plurality of clock cycles; and
identifying that the second read strobe signal outputs a second voltage level for the plurality of clock cycles, wherein the fault type is identified based at least in part on a difference between the first voltage level and the second voltage level.

8. A method, at a memory device, comprising:
receiving, from a host device, one or more commands to perform one or more operations on a memory array of the memory device;
determining a fault type, associated with performing the one or more operations, that is a recoverable fault type;
indicating a plurality of clock cycles for outputting data associated with a first command of the one or more commands using a first read strobe signal of a set of read strobe signals; and
indicating a fault signature using a second read strobe signal of the set of read strobe signals, the fault signature indicating the fault type that is the recoverable fault type from a plurality of fault types corresponding to different fault signatures associated with characteristics of the second read strobe signal relative to the first read strobe signal.

9. A method, at a memory device, comprising:
receiving, from a host device, one or more commands to perform one or more operations on a memory array of the memory device;

determining a fault type, associated with performing the one or more operations, that is an unrecoverable fault type;
indicating a plurality of clock cycles for outputting data associated with a first command of the one or more commands using a first read strobe signal of a set of read strobe signals; and
indicating a fault signature using a second read strobe signal of the set of read strobe signals, the fault signature indicating the fault type that is the unrecoverable fault type from a plurality of fault types corresponding to different fault signatures associated with characteristics of the second read strobe signal relative to the first read strobe signal.

10. The method of claim 8, further comprising:
outputting, using the second read strobe signal, a voltage level for a plurality of clock cycles, wherein the fault type is indicated based at least in part on the voltage level.

11. The method of claim 8, further comprising:
toggling the first read strobe signal between a first voltage level and a second voltage level according to a first periodicity, wherein indicating the plurality of clock cycles for outputting data is based at least in part on toggling the first read strobe signal; and
toggling the second read strobe signal between the first voltage level and the second voltage level according to a second periodicity, wherein the fault type is indicated based at least in part on a difference between the first periodicity and the second periodicity.

12. The method of claim 8, further comprising:
toggling the first read strobe signal between a first voltage level and a second voltage level according to a first periodicity, wherein indicating the plurality of clock cycles for outputting data is based at least in part on toggling the first read strobe signal; and
toggling the second read strobe signal between the first voltage level and the second voltage level according to the first periodicity, wherein the fault type is indicated based at least in part on the second read strobe signal being in phase with the first read strobe signal according to the first periodicity.

13. The method of claim 8, further comprising:
outputting, using the first read strobe signal, a first voltage level for a plurality of clock cycles; and
outputting, using the second read strobe signal, a second voltage level for the plurality of clock cycles, wherein the fault type is indicated based at least in part on a difference between the first voltage level and the second voltage level.

14. A method, at a host device, comprising:
transmitting, to a memory device, one or more commands to perform one or more operations on a memory array of the memory device;
identifying at least one transition of a first read strobe signal of a set of read strobe signals occurring exclusive of a plurality of clock cycles for receiving data from the memory device;
identifying a fault signature based at least in part on the first read strobe signal and a second read strobe signal, the fault signature indicating a fault type from a plurality of fault types corresponding to different fault signatures associated with characteristics of the second read strobe signal relative to the first read strobe signal, wherein the fault type is a recoverable fault or an unrecoverable fault; and performing one or more recovery operations based at least in part on the fault type indicated by the fault signature.

15. The method of claim 14, further comprising:

identifying that the fault type indicated by the fault signature is the recoverable fault;

reading one or more registers based at least in part on identifying the recoverable fault; and identifying a cause of the recoverable fault based at least in part on reading the one or more registers, wherein performing the one or more recovery operations is based at least in part on the cause of the recoverable fault.

16. The method of claim 14, further comprising:

identifying that the fault type indicated by the fault signature is the unrecoverable fault; and transitioning to a safe state mode based at least in part on identifying the unrecoverable fault.

17. The method of claim 14, further comprising:

identifying that the second read strobe signal outputs a voltage level for a plurality of clock cycles, wherein the fault type is identified based at least in part on the voltage level.

18. The method of claim 14, further comprising:

identifying that the first read strobe signal toggles between a first voltage level and a second voltage level according to a first periodicity; and identifying that the second read strobe signal toggles between the first voltage level and the second voltage level according to a second periodicity, wherein the fault type is identified based at least in part on a difference between the first periodicity and the second periodicity.

19. The method of claim 14, further comprising:

identifying that the first read strobe signal toggles between a first voltage level and a second voltage level according to a first periodicity; and identifying that the second read strobe signal toggles between the first voltage level and the second voltage level according to the first periodicity, wherein the fault type is identified based at least in part on the second read strobe signal being in phase with the first read strobe signal according to the first periodicity.

* * * * *